United States Patent
Watton et al.

(10) Patent No.: US 6,388,256 B1
(45) Date of Patent: May 14, 2002

(54) THERMAL DETECTOR ARRAY

(75) Inventors: Rex Watton, Malvern; Cyril Hilsum, Pinner, both of (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/424,615

(22) PCT Filed: May 14, 1998

(86) PCT No.: PCT/GB98/01379

§ 371 Date: Dec. 1, 1999

§ 102(e) Date: Dec. 1, 1999

(87) PCT Pub. No.: WO98/54554

PCT Pub. Date: Dec. 3, 1998

(30) Foreign Application Priority Data

May 28, 1997 (GB) .............................................. 9710843

(51) Int. Cl.[7] .................................................. G01J 5/00
(52) U.S. Cl. ............................... 250/338.4; 250/338.1; 250/338.2; 250/338.3
(58) Field of Search ............................ 250/332, 338.1, 250/338.2, 338.3, 338.4; 216/94; 29/592.1

(56) References Cited

U.S. PATENT DOCUMENTS

| | | | | |
|---|---|---|---|---|
| 3,816,750 A | * | 6/1974 | Liu ........................... | 250/338.3 |
| 4,142,207 A | | 2/1979 | McCormack et al. ....... | 348/165 |
| 4,589,952 A | * | 5/1986 | Behringer et al. ............ | 216/2 |
| 4,663,529 A | | 5/1987 | Jenner et al. ............ | 250/338.2 |
| 4,954,313 A | * | 9/1990 | Lynch ........................... | 419/9 |
| 5,070,026 A | * | 12/1991 | Greenwald et al. ............ | 438/3 |
| 5,077,474 A | | 12/1991 | Nix et al. .................... | 250/332 |
| 5,122,666 A | * | 6/1992 | Turnbull ................... | 250/338.3 |
| 5,130,542 A | | 7/1992 | Sibbald et al. ........... | 250/338.2 |
| 5,450,053 A | | 9/1995 | Wood .......................... | 338/18 |
| 5,602,043 A | * | 2/1997 | Beratan et al. ............... | 438/54 |
| 5,618,752 A | * | 4/1997 | Gaul .......................... | 438/626 |
| 5,627,082 A | | 5/1997 | Beratan et al. ............... | 438/55 |

* cited by examiner

Primary Examiner—Constantine Hannaher
Assistant Examiner—Shun Lee
(74) Attorney, Agent, or Firm—Nixon & Vanderhye P.C.

(57) ABSTRACT

A thermal detector device comprising an array of thermal detector elements, an array of microbridge structures comprising the array of thermal detector elements, readout silicon integrated circuitry (ROIC) and an interconnect layer on which the array of microbridge structures are arranged. The interconnect layer comprises a plurality of conducting interconnect channels providing an electrical connection between the microbridge structures and input contacts on the ROIC such that the microbridge structures are in electrical contact with, but are separated from, the readout silicon integrated circuitry. As the interconnect layer separates the microbridge structures from the ROIC, the detector material, typically a ferroelectric material, may be fabricated on the microbridge structures at a deposition or anneal temperature which is not limited by the avoidance of damage to the ROIC. Deposition temperatures of at least 500° C. or, preferably, at higher temperatures e.g. 700° C.–900° C., may therefore be used, enabling the fabrication of high performance ferroelectric or microbolometer thermal detector arrays. The invention also relates to a method of fabricating high performance thermal detector arrays comprising an interconnect layer.

22 Claims, 4 Drawing Sheets

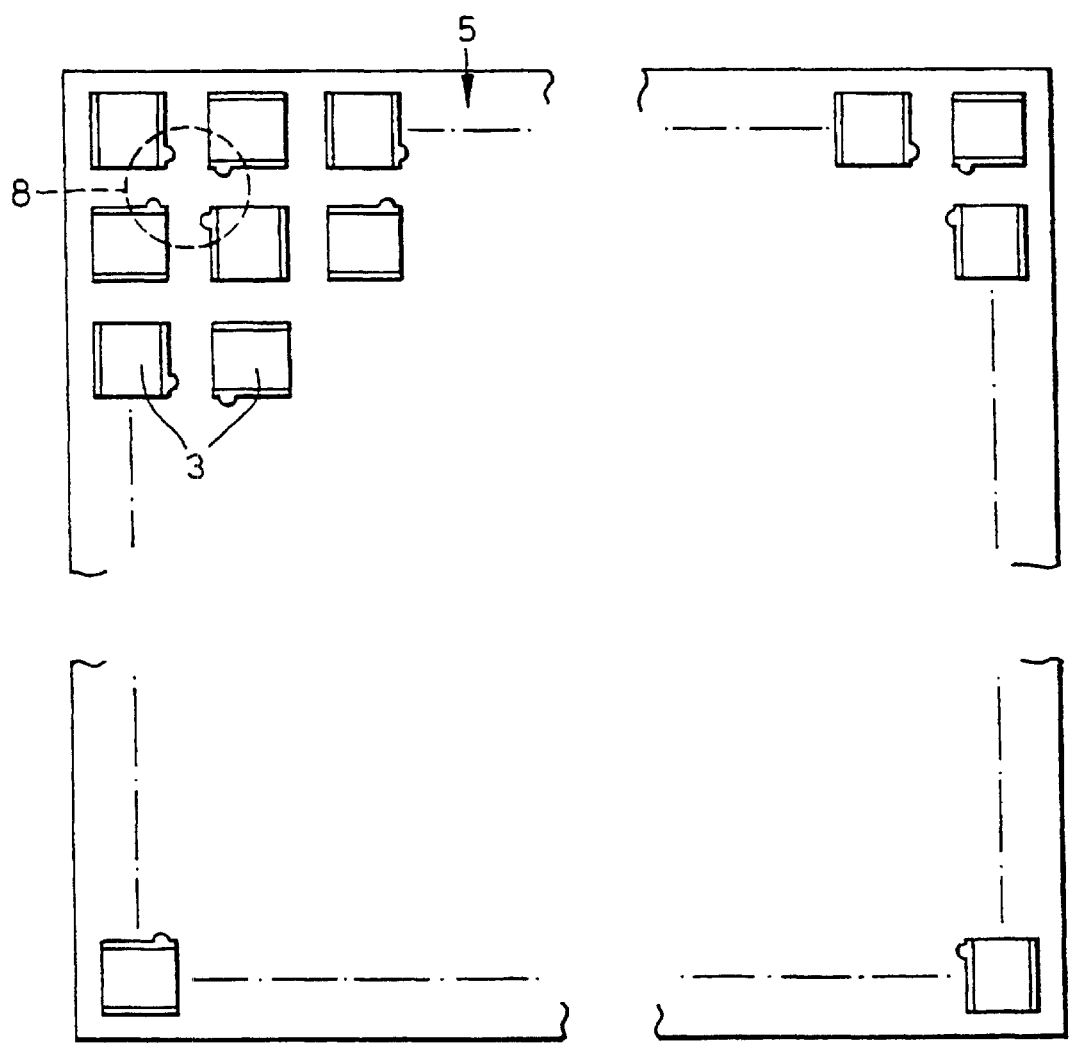

THERMAL DETECTOR ARRAY

BACKGROUND OF THE INVENTION

1. Field of the Invention

The invention relates to a composite thermal detector array comprising an array of discrete thermal detector elements. The array may be a linear or a two-dimensional array. Linear arrays are particularly suitable for applications where there is relative motion between the detector head and any objects being imaged. Two-dimensional detector arrays are used in a wide range of infrared imaging applications.

2. Discussion of Prior Art

Thermal detectors such as ferroelectric detectors and resistance bolometers are of interest due to their operation at ambient temperatures unlike the photon (or semiconductor) detectors which require cryogenic modules for cooling. Development of thermal detectors is currently directed towards the achievement of arrays having large numbers of elements with small inter-element pitch and to enhancing the level of temperature discrimination that may be observed in the scene above the inherent noise level in the detector array and the imaging system designed for the viewing of the video image.

Linear and two-dimensional arrays of thermal detectors have been constructed using, as the radiation sensitive element, both ferroelectric materials and also resistance bolometer materials, the latter from a range of oxide, metal and semiconductor materials. Ferroelectric wafers prepared from ceramic blocks and polished to thin sections have been bonded to the silicon readout integrated circuitry (IC) directly by metal bump bonding as described in U.S. Pat. No. 4,142,207. This patent further emphasises the desirability of improving the thermal isolation of the detector element from the silicon IC by bonding to the top of thin metal columns fabricated on the silicon IC, one for each element. Improved thermal isolation (i.e. low thermal conductance to the element) is necessary to secure high responsivity from the element when absorbing infrared radiation focused from the scene. The bump bonding process may involve a cold-weld between metal surfaces or a solder bump bond between wettable metal pads on the element and the input circuitry of the silicon IC [D J Pedder, *Hybrid Circuits,* Vol. 15. p4, 1988].

In U.S. Pat. No. 5,450,053 the thermal isolation of the detector elements is obtained by the construction of arrays of microbridge structures on the surface of the silicon readout integrated circuitry (ROIC) such that there is one microbridge per element. The microbridge supports the detector element above the IC on thin and narrow legs to achieve the low thermal conductance. The detector element material is deposited as a thin film on or as the microbridge structure and is provided with suitable electrodes to collect the signal and pass this down the legs to the silicon readout circuitry in the IC. The technique of depositing resistance bolometer material enables the fabrication of a large array of resistance micro-bolometers. The technique enables the fabrication of higher performance detector arrays than those fabricated using the bump bonding technique due to the lower thermal conductances that may be achieved.

It has been proposed [R. Watton, *Ferroelectrics,* Vol. 133, pp. 5–10, 1992] that ferroelectric thermal detector arrays of high performance may be fabricated using microbridge structures. The ferroelectric material may be deposited by various techniques, sol-gel processing, rf magnetron sputtering, laser ablation or MOCVD. However, a severe limitation in the deposition of the ferroelectric film onto the microbridge structures is the limit on the temperature that the silicon IC, which acts as substrate with the array of microbridge structures, can be raised to during the deposition. The silicon IC maximum temperature is restricted to the region of 500° C. to avoid damage to the circuitry providing the array readout functions (i.e. amplification and element matrix switching). However is has been proposed that to achieve good ferroelectric properties in the deposited ferroelectric film high substrate temperatures may be required either in the deposition process or in subsequent annealing [R Watton, ibid. and R Watton, *Integrated Ferroelectrics,* Vol. 4, pp175–186, 1994].

U.S. Pat. No. 3,801,949, relates to a thermal detector device in which an array of detector elements is fabricated on a silicon substrate containing the readout circuitry for the detector elements. A thin layer of silicon dioxide, deposited on the substrate, thermally insulates the substrate from the detector elements during detection of infrared radiation. The detector elements are fabricated on the substrate containing the detector readout circuitry prior to the etching of openings in the substrate which also serve to thermally isolate the detector elements from the circuitry during detector operation. However, as described previously, the problem exists that the silicon substrate containing the readout circuitry cannot withstand the elevated temperatures required to fabricate detector elements having good ferroelectric properties.

It is known that there exists an incompatibility between the temperatures required in the deposition or annealing of the ferroelectric films, to obtain the most favourable properties for thermal detector arrays, and the temperature limits set by avoidance of damage to the metallisation and circuits on the silicon readout IC. For example, annealing sputtered films of the ferroelectric lead scandium tantalate to temperatures between 800° C. and 900° C. results in ferroelectric properties in the films which approach those measured in the ceramic material used in the bump bonded technology described previously [R Watton and M A Todd, *Ferroelectrics,* Vol. 118, pp279–295, 1991]. Such values of ferroelectric properties, if combined with the higher thermal isolation of the microbridge element structures, would result in very high performance thermal detector arrays.

It has also been proposed that ferroelectric films of both lead zirconate titanate and lead scandium tantalate can be deposited or annealed at temperatures in the region of 500° C. but with reduced values of those ferroelectric properties which determine the imaging performance of thermal detector arrays [R Watton, *Ferroelectrics,* Vol. 184, pp 141–150, 1996]. The reduced values do not preclude a useful imaging performance from arrays prepared by these processes but significant improvements in performance will be available if the temperature limitation were removed.

SUMMARY OF THE INVENTION

The temperature limitation problem outlined above is overcome by the present invention. The invention relates to a composite structure for thermal detector arrays which allows the fabrication of ferroelectric element arrays on microbridge structures at higher temperatures than those presently allowed by the limitation of avoidance of damage to the readout integrated circuitry.

According to one aspect of the invention, a thermal detector device comprises;

an array of thermal detector elements for detecting infrared radiation and generating output detector signals, an array of microbridge structures comprising said detector elements, wherein each microbridge structure also includes a common contact and an output contact, wherein each of the common contacts is in electrical contact with each of the other common contacts, readout integrated circuitry having a plurality of input contacts, for processing the output detector signals, and an interconnect layer, having front and rear surfaces, thermally isolating the array of microbridge structures from the readout integrated circuitry and comprising a plurality of interconnect channels between said front and rear surfaces, wherein the interconnect channels provide an electrical connection between the output contact of each of the microbridge structures and the associated input contact on the readout integrated circuitry such that the microbridge structures are in electrical contact with, but are separated from, the readout integrated circuitry wherein the interconnect layer is a wafer which supports the array of microbridge structures during fabrication of the latter and wherein the input contacts of the readout circuitry are substantially vertically aligned with the output contacts.

At the rear face of the interconnect layer, the interconnect channels may be bump bonded to the input contacts of the readout integrated circuitry.

In addition to the detector elements, each microbridge structure may also comprise additional support layers. Additional support layers may be required, in particular, for microbridge structures comprising thin detector elements which do not provide sufficient support themselves.

In a preferred embodiment, the detector elements may be comprised of a ferroelectric material. The interconnect channels may each comprise a channel of electrically conducting material, for example polysilicon or an electroplated, chemically plated or vapour deposited metal. Each interconnect channel may further comprise a channel of dielectric material for electrically isolating the conducting material from the interconnect layer material. Typically, the dielectric material may be an oxide or a nitride layer formed from the interconnect layer material.

The interconnect layer may be any one of silicon, glass or a ceramic material or any other material capable of supporting conducting channels in the interconnect layer. Alternatively, the interconnect layer may be electrically conducting or semi-conducting material. Preferably, the interconnect layer material is thermally matched in thermal expansion properties to the underlying silicon layer.

Typically, each of the detector elements may have an electrical capacitance of between 1 picofarad and 1 nanofarad and, preferably, the electrical capacitance of each interconnect channel is at least less than one tenth of the electrical capacitance of each ferroelectric detector element.

According to a second aspect of the invention, a method of fabricating a thermal detector device comprises the steps of;

(i) providing an interconnect layer having front and rear surfaces, wherein the interconnect layer is a wafer comprising a plurality of interconnect channels between said front and rear surfaces, (ii) fabricating an array of thermal detector elements as an array of microbridge structures on the interconnect layer, wherein each microbridge structure includes a common contact and an output contact, each of the common contacts being in electrical contact with each of the other common contacts and each interconnect channel being in contact with the output contact on one of the microbridge structures, and (iii) subsequently bonding the interconnect channels at the rear surface of the interconnect layer to readout silicon integrated circuitry, such that the microbridge structures are in electrical contact with, but are separated from, the readout integrated circuitry.

The method may further comprise the step of fabricating at least one additional support as part of the microbridge structures. The interconnect channels may be formed by a reactive ion etch technique.

The thermal detector elements may be fabricated as part of the microbridge structures by means of a deposition process. The fabrication of the array of thermal detector elements may also include the step of annealing the thermal detector elements. Preferably, at least one of the deposition process or the annealing process is carried out at a temperature well above the limiting temperature which applies to processing directly on the silicon readout wafer. For example, at least one of the deposition process or the annealing process may be carried out at a temperature of at least 500° C. and, more preferably, at a temperature of at least 700° C.

BRIEF DESCRIPTION OF THE DRAWINGS

The invention will now be described by example only with reference to the following figures in which;

FIG. 4 shows a schematic plan view of the array of microbridge structure elements in the thermal detector array and FIG. 5 shows a schematic plan view of an alternative configuration of the array of microbridge structure elements in the thermal detector array.

DETAILED DISCUSSION OF PREFERRED EMBODIMENTS

Figure 1:
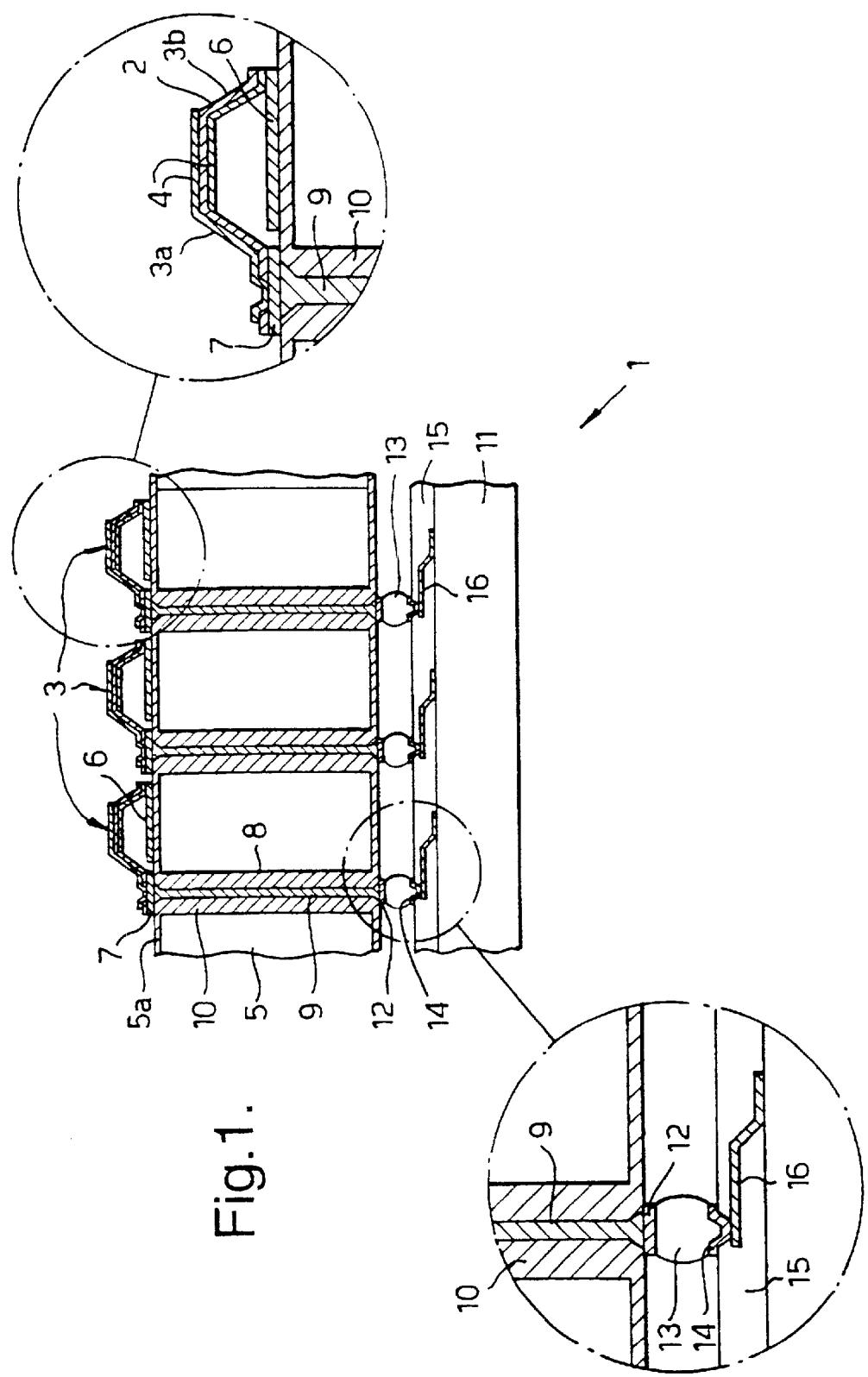
FIG. 1 shows a schematic sectional view of a part of thermal detector array of the invention comprising a silicon interconnect layer.

FIG. 1 shows a schematic cross sectional diagram of part of a thermal detector device 1 comprising an array of detector elements 2 fabricated as an array of microbridge structures 3. Three microbridge structures 3 are shown, although the complete device may comprise any number of microbridge structures in a linear or a two dimensional array (e.g. 256×128 or 256×256).

Each microbridge structure 3 has two 'legs' 3a,3b. In the example shown each microbridge structure 3 comprises two electrode layers 4 which sandwich the detector element 2 and provide the electrodes for the microbridge structure 3, one associated with each leg 3a,3b. Typically, the detector elements 2 may be comprised of a ferroelectric material which may be fabricated as the microbridge structure 3 by deposition or annealing or a combination of both processes.

The detector elements 2 may provide sufficient support to form the microbridge structure themselves (the electrodes 3 do not provide any support). However, other support layers (not shown) may also be required to reinforce the microbridge structures. In particular, additional support layers may be required for microbridge structures comprising thin detector elements 2 which cannot provide sufficient support.

The array of microbridge structure 3 is fabricated on the front surface of a wafer of substrate material 5. For the purpose of this specification, this wafer of substrate material 5 shall be referred to as the 'interconnect layer' or the 'interconnect wafer'. The two electrode layers 4 on each microbridge structure 3 make contact with metal layers or electrodes 6 and 7 on the surface of the interconnect layer 5. The metal layer 6 forms a common electrode connecting one leg 3b of each microbridge structure 3 in a common connection (i.e. the metal layer 6 is joined between microbridge elements 3). The metal layers 7, one metal layer 7 being associated with each microbridge structure 3, are connected to the other leg 3a of each individual microbridge structure 3. If the interconnect layer 5 is a silicon wafer, the wafer 5 may be coated on both front and rear surfaces with a passivating dielectric layer 5a, as shown in FIG. 1. The electrode layers 4 collect the output signals from the detector elements 2 and pass them down the legs 3a.3b to the metal layers 6,7. An important feature of the interconnect layer 5 is that it contains no active circuitry, only the common metal layer 6 which runs across the top surface of the layer 5.

The interconnect layer 5 also comprises an array of electrically conducting channels 8, one channel per microbridge structure 3. The channels 8 shall be referred to as the "interconnect channels". The interconnect layer 5 may be silicon, glass or a ceramic material, or any other material which is able to support the interconnect channels 8. Preferably, the material is thermally matched in thermal expansion properties to the underlying silicon.

The interconnect channels 8 are shown to run substantially vertically through the interconnect layer 5 from its front surface to its back surface. The conducting interconnect channels 8 may be formed by filling holes or pores, penetrating through the interconnect layer 5 with an electrically conducting filament 9. These electrically conducting filaments 9 may be set into a dielectric material 10 such that they are electrically isolated from the bulk material of the interconnect layer 5, for example if a silicon interconnect layer is employed.

The thermal detector device 1 also comprises readout integrated circuitry (ROIC), typically formed on a readout silicon wafer 11, for processing the output signals from the detector elements 2. On the front surface of the interconnect layer 5, each interconnect channel 8 is in contact with the metal layer 7 in contact with leg 3a of the relevant microbridge structure 3 via electrode layer 4. Each interconnect channel 8 is therefore in electrical contact with the associated detector element 2. Output signals from the detector elements 2 are therefore passed down the legs 3a,3b to the metal layers 6,7, and from the metals layers 7, the signals are passed through the interconnect channels 8. The interconnect layer 5 therefore provide a means of conducting the output signals from the detector elements 2 to the readout wafer 11 whilst the interconnect layer 5 physically separates the microbridge structures 3, and hence the detector elements 2, from the readout wafer 11.

At the rear surface of the interconnect layer 5 the interconnect channels 8 are connected to electrically conducting pads 12. Solder bonds 13 may be used to connect these electrically conducting pads 12 to input pads 14 on the silicon readout wafer 11. The process of bump bonding using solder would be conventional to one skilled in the art.

The input pads 14 on the silicon readout wafer 11 may be arranged on dielectric passivation or intermetallic dielectric layers 15. For clarity, FIG. 1 shows layer 15 as a single layer, although in practice this layer may comprise at least two dielectric layers. Within this layer (or layers) 15, the input pads 14 are connected to metal layers 16 which form part of the metallisation structure on the readout wafer 11. The metal layers 16 connect the signal at the input pads 14 to subsequent pre-amplifier inputs (not shown).

For the thermal detector device shown in FIG. 1, the fabrication of the microbridge structures 3, and the subsequent deposition or annealing of the ferroelectric detector material 2, may be performed prior to the bump bonding of the silicon readout wafer 11 to the interconnect layer 5. Temperature restrictions on the deposition or annealing of the ferroelectric material 2 are therefore not restricted by the silicon readout wafer 11 and the survival of its circuitry, but only by the interconnect layer 5 and the materials used for the common electrode and the electrically conducting contacts and channels.

Preferably, in order to achieve higher ferroelectric thermal detector performance, the fabrication of the ferroelectric material as the microbridge structures needs to be carried out at a temperature greater than it is possible to achieve in the fabrication of device configurations where the silicon readout wafer is directly connected to the microbridge element and the ferroelectric material. For such known device configurations, this temperature limitation is typically between 450° C. and 550° C. As the detector performance increases with the deposition or annealing temperature of the ferroelectric material, carrying out the ferroelectric deposition or anneal at higher temperatures then this gives enhanced detector performance. Even higher temperatures (e.g. 700° C.–900° C.) result in further enhanced performance devices. The present invention is advantageous in that it enables such higher fabrication temperatures to be used and therefore enables higher performance ferroelectric thermal detector arrays to be fabricated.

The process of fabricating the ferroelectric material 2 as the microbridge structures 3 may be achieved by the deposition of the ferroelectric material, preferably at a temperature greater than 500° C., or more preferably at even higher temperatures e.g, greater than 700° C. Alternatively, the fabrication process may involve initially depositing the material on the microbridge structure and then subsequently annealing the material, in which case the deposition process may be carried out at a lower, more practicable temperature and the anneal carried out at a higher temperature to achieve the required detector performance. The processes of depositing or annealing the detector elements would be conventional to one skilled in the art.

The interconnect layer 5, its common electrode 6, its through-wafer interconnect materials, including any electrically conducting and insulating materials which are used, are chosen so as to allow high deposition or annealing temperatures for the ferroelectric material. The materials must therefore be able to withstand temperatures in excess of 500° C., and preferably temperatures greater than 700° C. For the purpose of this specification, a material capable of withstanding the required deposition or annealing temperature shall be taken to mean a material that does not melt, crack, split or delaminate at the deposition or annealing temperature.

The interconnect layer 5 may be a silicon wafer or a glass or a ceramic material, for example Pyrex glass™ or alumina, which are similar to silicon in terms of thermal expansion, or any other material capable of supporting the interconnect channels 8 and preferably thermally matched in thermal expansion properties to the underlying silicon. Typically, the conducting material 9 in the interconnect channels 8 may be polysilicon, which may be conveniently deposited from its gaseous phase. Alternatively, the conducting filament may be formed using vapour deposited, electroplated or chemically plated metals, e.g. copper, gold, tungsten or nickel or may be formed from a diffused channel of aluminium. Typically, the dielectric material 10 in the interconnect channels 8 may be an oxide or nitride layer formed from the interconnect layer material or may be a deposited film of dielectric material.

After fabrication of the microbridge structure array at an elevated temperature required for enhanced ferroelectric properties, the interconnect layer 5 may be solder bump bonded to the silicon readout layer 11 via the solder bonds 13 which wet the metal pads 12 and 14. This may be done using solder and known techniques. Alternatively, the bond between metal pads 12 and 14 may be performed by coating the surfaces to be connected with a suitable metal to give a cold weld on contact and pressure.

In order to avoid stress and damage arising through the temperature used for solder bonding, preferably a requirement of the material of the interconnect wafer 5 is that it should be matched closely in thermal expansion to the silicon readout wafer 11. Materials such as silicon itself and some glasses, including Pyrex glasses™, are particularly suitable with thermal expansions varying by less than 30% from that of silicon. As mentioned previously, if a silicon interconnect layer 5 is used then it is preferable to electrically isolate the electrically conducting channels 9 from the bulk material of the interconnect layer 5.

Typically, the interconnect layer 5 may have a thickness of between 0.1–1 mm and, preferably, is in the region of 0.5 mm thick such that it provides sufficient rigidity for the processing steps to be performed on its upper and lower surfaces. Typically, the diameter of the interconnect channels 8 may be between 10–50 $\mu$m (FIGS. 1 and 2 are not drawn to scale).

Alternatively, in order to ease the formation of the interconnect channels 8 through the interconnect layer 5, the layer 5 may be thinned to the region of 100–200 $\mu$m thickness over the area of the elements of the array within a surrounding "picture frame" of thicker support material (i.e. over the area of the microbridge structures 3 of the array). Such a layer 5 would also be mechanically stable to allow the fabrication of the array of microbridge structures 3.

Porous silicon technology [e.g. V Lehmann, *J. Electrochem. Soc.,* Vol. 143, No. 1, pp. 385–390, January 1996] may be used to etch the interconnect channels 8 in a silicon interconnect wafer 5. This technology enables small diameter pores or channels to be etched through silicon wafers with large aspect (length/diameter) ratios. Using this technique, it is possible to achieve a substantially regular array of interconnect channels 8 in the silicon interconnect layer 5. The walls of the interconnect channels 8 may be oxidised prior to the deposition of, for example, the polysilicon conducting material 9. The oxidation of the walls of the interconnect channels 8 and the deposition of polysilicon conducting material 9 are conventional techniques used in microelectronic manufacturing. Alternatively, the interconnect channels 8 may be etched in a regular array through a silicon wafer by a reactive ion etch technique using reactive gases in a plasma.

Figure 2:
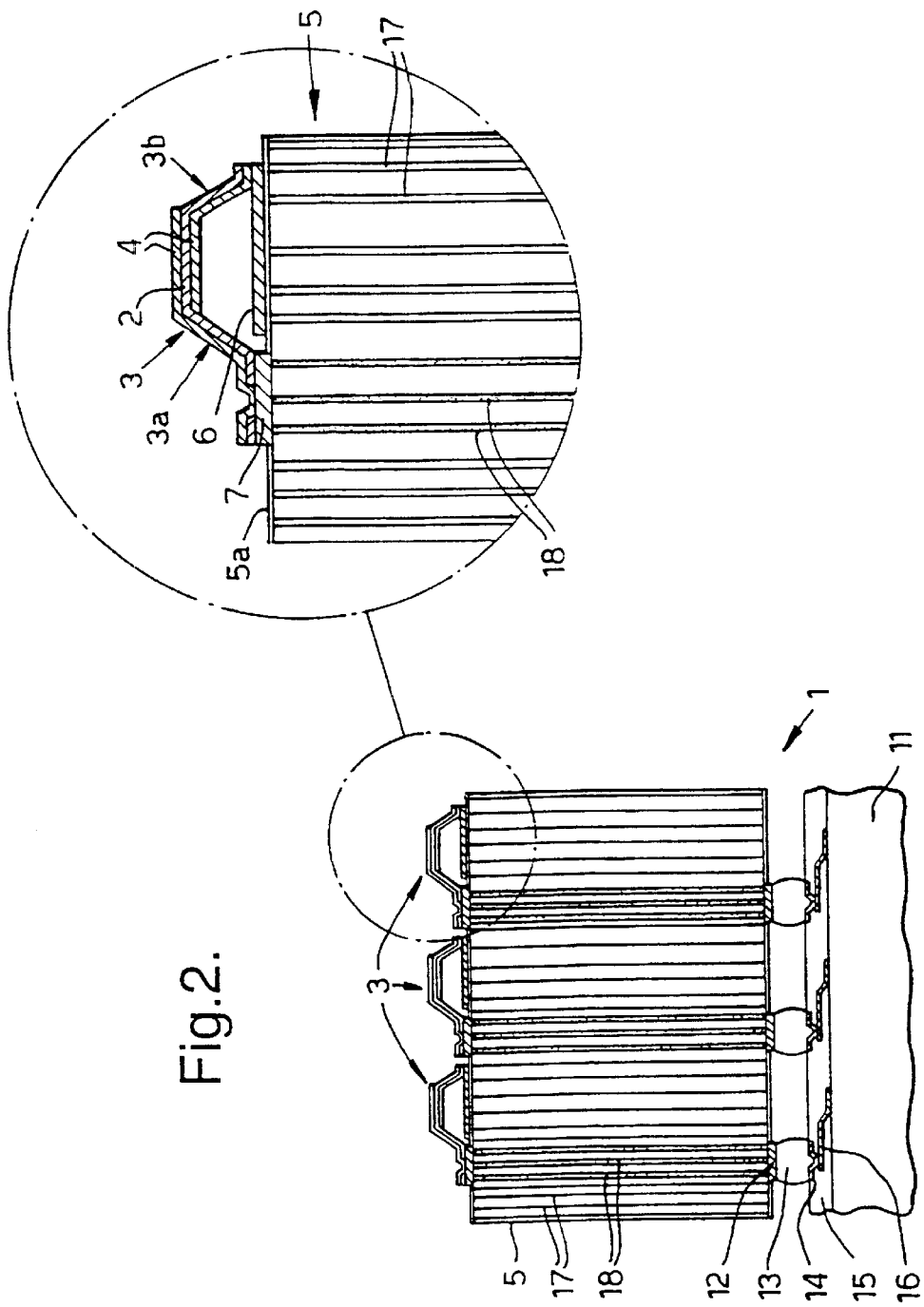
FIG. 2 shows a schematic sectional view of a part of a thermal detector array, comprising a porous ceramic interconnect layer.

FIG. 2 shows an alternative embodiment of the invention comprising an alumina interconnect layer 5. As before, the microbridge structures 3 are shown with two legs 3a,3b, and comprise the ferroelectric material 2 sandwiched between two electrode layers 4. In this configuration, the interconnect layer 5 is shown as having an array of microchannels (or micropores) 17 capped with an electrically insulating material 5a, except in regions where through-wafer connections are required (shaded microchannels 18). In these regions, the microchannels 18 are filled with a metal by electroplating, chemical plating or other method so that they form the required conducting means. Alternatively, it may be more convenient to fill all of the microchannels with a metal and those microchannels which are not required to provide a connection are capped with an electrically insulating material 5a. For interconnect layers made of ceramic or glass material, it would not be necessary to insulate the conducting filaments from the bulk interconnect layer material itself.

If an alumina interconnect wafer is used, electrochemical anodisation techniques may be used to form the microchannels 17,18 in the interconnect layer 5 (e.g. *'Theoretical modelling of porous oxide growth on aluminium'*, M Saito et al, *J. Phys. D: Appl. Phys.* 25, pp 1258–1263, 1992). If the process of electrochemical anodisation is used, the microchannels 17,18 formed in the interconnect layer 5 will typically be irregularly spaced, as illustrated in FIG. 2. In this case, where the spacing of the microchannels 17,18 is not regular, or if the number of microchannels does not match the number of microbridge structures 3, and hence the number of detector elements 2, groups of microchannels may be used collectively to form the required interconnections in positions corresponding to the positions of the microbridge structure electrodes 7. What is important is that the interconnecting groups of microchannels are substantially regularly spaced, such that they provide a connection to the regularly spaced microbridge structures 3. This may be achieved by filling or capping the microchannels 18 with oxide (or electrically insulating material) 5a except where through-layer interconnections are required. Standard electroplating techniques can be used to provide the metallic filling in these contact areas. For example, using an alumina interconnect wafer 5 in this way, uniform microchannels, typically having a diameter up to 60 nm, may be formed to a depth in the region of typically 100 $\mu$m.

If a glass interconnect layer is used, and is thinned to the region of 100–200 $\mu$m thickness over the area of the elements of the array, the glass would be mechanically stable to allow the fabrication of the array of microbridge structures. However, the temperature allowed for deposition or annealing in the fabrication of the detector elements would be limited to the softening temperature of the glass, e.g. in the region of 600° C. A ceramic membrane such as alumina would permit much higher temperatures to be used.

It is important that the geometry and construction of common electrode 6 and the interconnect channels do not impose a high stray electrical capacitance at the input to the silicon readout wafer as this will reduce the device performance. The responsivity derived from the ferroelectric detector material when it absorbs infrared radiation imaged from the scene is inversely proportional to the sum of the detector element capacitance and the stray capacitance at the input to the subsequent amplifier (not shown). The stray capacitance must therefore be kept small compared with the detector element capacitance.

The invention is concerned with thermal detector arrays having an inter-element pitch (i.e. the spacing of the detector elements 2) in the range 100 $\mu$m down to 25 $\mu$m. The thickness of the deposited ferroelectric material 2 will vary from 1 $\mu$m down to 0.1 $\mu$m. Relative permittivity of the ferroelectric materials used for the detector elements will vary from 300 up to 5000 dependent on the actual material and its operating electrical bias and temperature. The element capacitance therefore could range from 1 picofarad to 3 nanofarad, but will preferably be 2 to 50 picofarad.

For example, using a silicon interconnect wafer, as shown in FIG. 1, the interconnect channels 8 may be formed by etching channels of the order of 20 μm thick through the interconnect layer 5, coating the channel with oxide having a thickness of several microns and filling with a central core 9 of an electroplated metal. Such an interconnect channel 8 has a capacitance in the region of 0.3 picofarad per millimeter thickness of silicon. Thus an interconnect layer 5 having a thickness of a fraction of a millimeter will ensure that the stray capacitance is maintained at a level well below the detector element capacitance, as desired.

To avoid cross-coupling between elements due to stray capacitance between adjacent interconnect cores 9, it may be preferable to use a conducting or semi-conducting interconnect wafer 5 having a suitable electrical conductivity such that it may be connected to the common electrode 6, forming a common earth for the array elements. For example, an interconnect wafer of silicon may be doped by conventional techniques used in microelectronic engineering to achieve the required conductivity.

Figure 3:
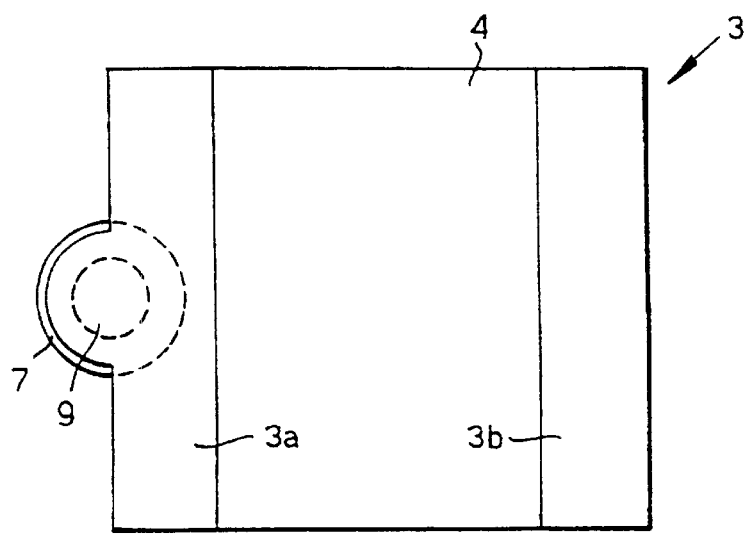
FIG. 3 shows an enlarged plan view of one of the microbridge structures in FIG. 1.

FIG. 3 shows a enlarged plan view of a simplified, single microbridge structure 3 of the array shown in FIG. 1. The two legs 3a,3b are shown sloping down on either side of the top electrode layer 4, underneath which is the detector element 2 and the lower metal layer 4 (layers 2 and 4 are obscured in FIG. 3), with the base of the leg 3a in contact with the metal layer 7 on the front surface of the interconnect layer 5. The position of contact is shown to be approximately at the centre of the base of the leg 3a in this representation, although this contact may be made at any point along the base of the leg 3a. To make a suitable contact between the base of the leg 3a, through the electrode layer 4, and the metal layer 7 requires suitable metallisation on the surface of the interconnect layer 5 to give a contact area of at least 1 μm². In this figure, the conducting channel 9 of the interconnect channel goes into the page. The geometry of the structure shown in FIG. 3 is not expected to give the lowest thermal conductance from the element to the interconnect wafer and structures having narrower, longer legs extending down the sides of the element, or folded underneath, may be preferred and would be known to one skilled in the art.

Figure 4:
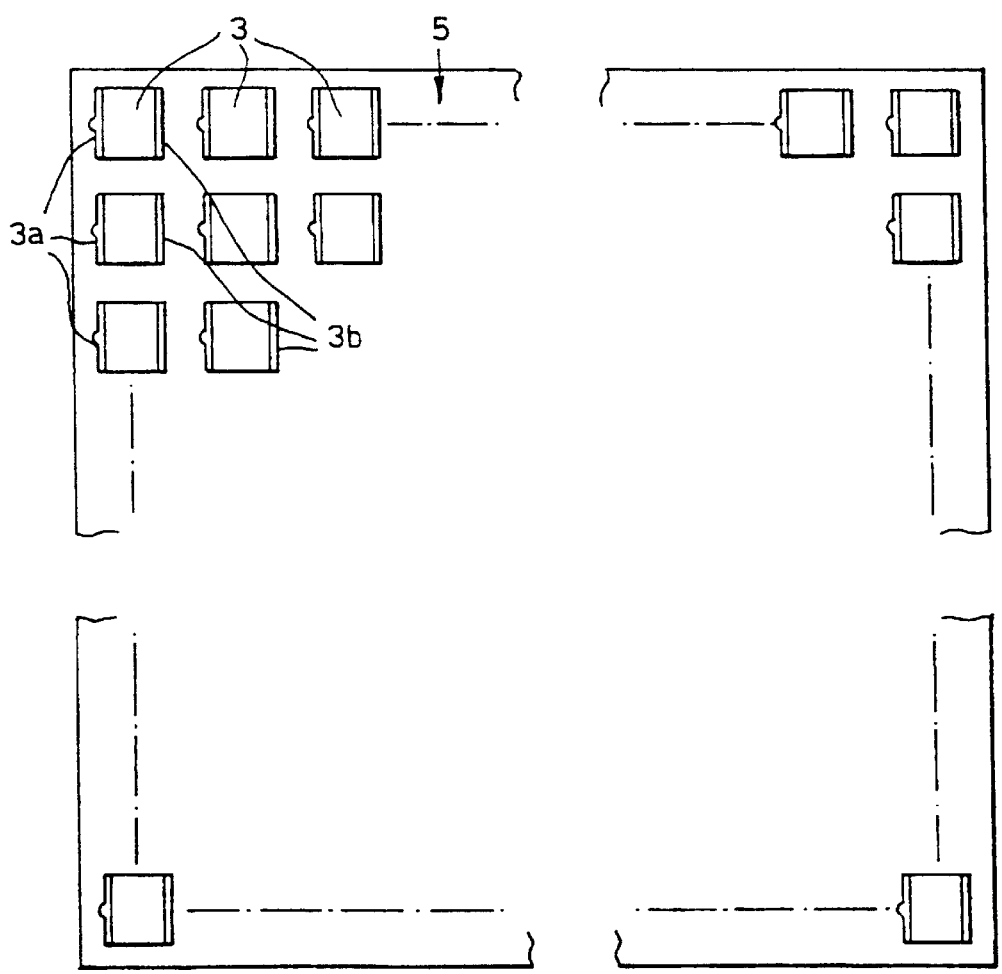

FIGS. 4 and 5 show plan views of the composite thermal detector device 1 and show two different configurations of the microbridge structure orientation. For clarity, not all of the microbridge structures 3 and their components have been numbered and the detailed structure of each microbridge and the interconnect layer are not shown. In FIG. 3, the microbridge structures 3 all have a like orientation such that the legs 3a,3b. and therefore the metal contacts 6,7 (see FIG. 1), are regularly spaced. This orientation is compatible with an interconnect layer 5 having regularly spaced interconnect channels 8, as shown in FIGS. 1 and 2.

As the diameter of the channels formed through the interconnect layer 5 may vary by up to a large fraction of the interconnect channel pitch, more than one filamentary conductor may be established in an individual interconnect channel 8 without there being an electrical connection between separate conductor filaments. In the configuration shown in FIG. 5, the microbridge structures 3 are therefore oriented such that, for example, the contacts on the legs 3a of four adjacent microbridge structures 3 are in close proximity, thereby leading to a simplification of the electrode geometry on the surface of the interconnect layer 5. Geometry's such as this, however, do involve more closely packed geometry's for the solder or bump bonds in the interfacing of the ROIC.

The orientations of the microbridge structures 3 on the surface of the interconnect layer are not restricted to the particular geometry's shown in the examples in FIGS. 4 and 5.

The thermal detector device 1 is advantageous in that higher fabrication temperatures may be used to deposit or anneal the detector elements on the microbridge structures, therefore enabling high performance ferroelectric or microbolometer thermal detector arrays to be fabricated. The method of fabricating the device is therefore easily compatible with silicon processing techniques.

What is claimed is:

1. A method of fabricating a thermal detector device characterised by the steps of;
   (i) providing an interconnect layer having front and rear surfaces, wherein the interconnect layer is a wafer comprising a plurality of interconnect channels between said front and rear surfaces,
   (ii) fabricating an array of thermal detector elements as an array of microbridge structures on the interconnect layer, wherein each microbridge structure includes a common contact and an output contact, each of the common contacts being in electrical contact with the each of the other common contacts and each interconnect channel being in contact with the output contact on one of the microbridge structures, and
   (iii) subsequently bonding the interconnect channels at the rear surface of the interconnect layer to readout silicon integrated circuitry, such that the microbridge structures are in electrical contact with, but are physically separated from, the readout integrated circuitry.

2. The method of claim 1, and further comprising the step of fabricating at least one additional support layer as part of the microbridge structures.

3. The method of claim 1, wherein the interconnect channels are formed by a reactive ion etch technique.

4. The method of claim 1 wherein the thermal detector elements are fabricated on the microbridge structures by means of a deposition process.

5. The method of claim 4, wherein the fabrication of the array of thermal detector elements includes the step of annealing the thermal detector elements.

6. The method of claim 5 wherein the annealing of the thermal detector elements is carried out at a temperature of at least 500° C.

7. The method of claim 6 wherein the anneal of the thermal detector elements is carried out at a temperature of at least 700° C.

8. The method of claim 4 wherein the deposition of the thermal detector elements is carried out at a temperature of at least 500° C.

9. The method of claim 8 wherein the deposition process of the thermal detector elements is carried out at a temperature of at least 700° C.

10. A thermal detector device comprising;
   an array of thermal detector elements for detecting infrared radiation and generating output detector signals,
   an array of microbridge structures carrying said detector elements, wherein each microbridge structure includes a common contact and an output contact, wherein each of the common contacts is in electrical contact with the each of the other common contacts,
   readout integrated circuitry having a plurality of input contacts, for processing the output detector signals, and
   an interconnect layer, having front and rear surfaces, thermally isolating the array of microbridge structures from the readout integrated circuitry and comprising a plurality of interconnect channels between said front and rear surfaces, wherein the interconnect channels provide an electrical connection between the output contact of each of the microbridge structures and the associated input contact on the readout integrated circuitry such that the microbridge structures are in electrical contact with, but are physically separated from, the readout integrated circuitry, characterised in that the interconnecting layer is a wafer which supports the array of microbridge structures during fabrication of the latter and in that the input contacts of the readout integrated circuitry are substantially vertically aligned with the output contacts.

11. The thermal detector device of claim 10, wherein each microbridge structure also comprises additional support layers in addition to the detector elements.

12. The thermal detector device of claim 10 wherein the detector elements are comprised of a ferroelectric material.

13. The thermal detector device of claim 10 wherein the interconnect layer is any one of silicon, glass or a ceramic material.

14. The thermal detector device of claim 10 wherein the interconnect layer is an electrically conducting or semiconducting material.

15. The thermal detector device of claim 10, wherein the interconnect channels each comprise a channel of electrically conducting material.

16. The thermal detector device of claim 15 wherein the conducting material is polysilicon.

17. The thermal detector device of claim 15 wherein the conducting material is an electroplated or chemically plated metal.

18. The thermal detector device of claim 15 wherein the conducting material is a vapour deposited metal.

19. The thermal detector device of claim 15 wherein each interconnect channel further comprises a channel of dielectric material for electrically isolating the conducting material from the interconnect layer material.

20. The thermal detector device of claim 19 wherein the dielectric material is an oxide or a nitride layer formed from the interconnect layer material.

21. The thermal detector device of claim 10 wherein each of the detector elements has an electrical capacitance of between 1 picofarad and 1 nanofarad.

22. The thermal detector device of claim 21 wherein each interconnect channel has an electrical capacitance which is at least one tenth less than that of the electrical capacitance of each ferroelectric detector element.

* * * * *